United States Patent
Kuttner et al.

(10) Patent No.: US 9,444,486 B2
(45) Date of Patent: *Sep. 13, 2016

(54) DIGITAL TO ANALOG CONVERTER COMPRISING MIXER

(71) Applicant: Intel Deutschland GmbH, Neubiberg (DE)

(72) Inventors: Franz Kuttner, St. Ulrich (AT); Michael Fulde, Drobollach (AT)

(73) Assignee: Intel Deutschland GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,088

(22) Filed: Jul. 21, 2014

(65) Prior Publication Data

US 2014/0328429 A1  Nov. 6, 2014

Related U.S. Application Data

(63) Continuation of application No. 13/688,980, filed on Nov. 29, 2012, now Pat. No. 8,847,806.

(51) Int. Cl.
*H03M 1/66* (2006.01)
*H03M 1/06* (2006.01)
*H03M 1/68* (2006.01)

(52) U.S. Cl.
CPC ............ *H03M 1/66* (2013.01); *H03M 1/0624* (2013.01); *H03M 1/685* (2013.01)

(58) Field of Classification Search
CPC .... H03M 1/765; H03M 1/802; H03M 1/806; H03M 1/66; H03M 1/00; H03M 1/804; H04L 27/34; H04L 27/362; H04L 27/3818
USPC .......................................... 341/144; 375/295
See application file for complete search history.

(56) References Cited

U.S. PATENT DOCUMENTS

| | | | |
|---|---|---|---|
| 5,519,396 A | 5/1996 | Distinti | |
| 6,163,283 A * | 12/2000 | Schofield | 341/50 |
| 6,628,219 B2 * | 9/2003 | Dedic | 341/144 |
| 6,831,582 B2 | 12/2004 | Kuttner et al. | |
| 6,919,858 B2 | 7/2005 | Rofougaran | |
| 6,937,848 B2 * | 8/2005 | Eloranta et al. | 455/118 |
| 7,176,823 B2 | 2/2007 | Zabroda | |
| 8,106,803 B2 | 1/2012 | Hurwitz et al. | |
| 8,111,182 B2 | 2/2012 | Kuttner | |
| 8,238,845 B2 | 8/2012 | Hurwitz et al. | |
| 8,446,184 B2 | 5/2013 | Van Der Goes et al. | |

(Continued)

OTHER PUBLICATIONS

U.S. Appl. No. 14/457,184, filed Aug. 12, 2014.
Notice of Allowance dated Jun. 30, 2015 in connection with U.S. Appl. No. 14/457,184.
Non Final Office Action Dated Feb. 26, 2015 U.S. Appl. No. 14/457,184.

(Continued)

*Primary Examiner* — Khai M Nguyen
(74) *Attorney, Agent, or Firm* — Eschweiler & Associates, LLC

(57) ABSTRACT

One example described herein relates to a digital to analog converter (DAC). The DAC includes a digital signal input configured to receive a multi-bit digital input signal, and a plurality of unit cells arranged in rows and columns. A row decoder and a column decoder provide respective control signals to respective rows and respective columns to selectively couple a number of the unit cells to an output of the DAC. The number of unit cells which are coupled to the output by the control signals is dependent on the multi-bit digital input signal. At least one of the control signals is modulated based on a local oscillator signal.

20 Claims, 7 Drawing Sheets

(56) References Cited

U.S. PATENT DOCUMENTS

| | | |
|---|---|---|
| 8,604,958 B2 | 12/2013 | Pfann et al. |
| 8,674,867 B1 | 3/2014 | Klepser et al. |
| 8,682,264 B2 * | 3/2014 | Kurose .......................... 455/91 |
| 2004/0135714 A1 | 7/2004 | Kuttner et al. |
| 2009/0140902 A1 | 6/2009 | Park |
| 2011/0085616 A1 | 4/2011 | Kuttner |
| 2012/0286891 A1 | 11/2012 | Schimper et al. |
| 2013/0135494 A1 | 5/2013 | Kim et al. |
| 2013/0251068 A1 | 9/2013 | Boos et al. |
| 2014/0146913 A1 | 5/2014 | Kuttner et al. |
| 2014/0146914 A1 | 5/2014 | Kuttner et al. |

OTHER PUBLICATIONS

Taoufiq Bellamine, 8 Bit Current Steering DAC, A project for ECE 547 "VLSI Design" Spring Semester 2007.

Non-Final Office Action dated Jan. 14, 2014 for U.S. Appl. No. 13/688,867.

Notice of Allowance dated May 21, 2014 U.S. Appl. No. 13/688,867.

Non-Final Office Action dated Jan. 21, 2014 U.S. Appl. No. 13/688,980.

Notice of Allowance dated Jun. 9, 2014 U.S. Appl. No. 13/688,980.

Notice of Allowance dated Oct. 28, 2013 U.S. Appl. No. 13/688,662.

* cited by examiner

DIGITAL TO ANALOG CONVERTER COMPRISING MIXER

CROSS REFERENCE TO RELATED APPLICATIONS

This application is a Continuation Patent Application claiming priority to US patent application Ser. No. 13/688,980 filed on Nov. 29, 2012 in the name of Franz Kuttner, et al., entitled "Digital to Analog Converter Comprising Mixer" and is herein incorporated in its entirety.

BACKGROUND

In some applications, signals are processed digitally, converted to analog signals, and then mixed with a local oscillator signal to obtain a signal with a desired frequency. Wireless transmitters are an example of such an application, as signals are processed digitally at a so-called baseband frequency, converted to an analog signal via a digital to analog converter (DAC), and mixed with a radio frequency signal to obtain a radio frequency transmit signal, which is then transmitted via an antenna.

Unfortunately, some DAC structures are susceptible to "glitches" and other timing imperfections. This can be due to small differences in path lengths and/or capacitances in the DACs, particularly when the DACs are used in high-frequency applications such as wireless communication. In extreme cases, these glitches can lead to errors in transmitted or received signals. In less extreme cases where the glitches are essentially self-correcting transients, the glitches can still cause excess power consumption due to the current and voltage excursions.

DETAILED DESCRIPTION

Figure 1A:
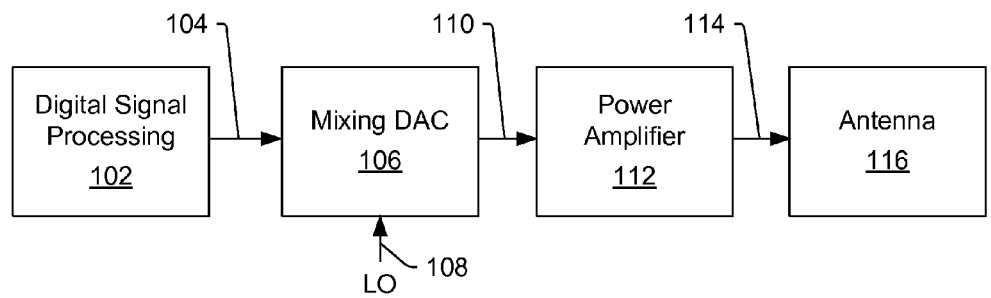
FIG. 1A shows a block diagram of a transmitter that makes use of a mixing digital to analog converter (DAC).

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Digital-to-analog converters (DACs) convert a multi-bit digital signal to an analog signal. The number of bits present in the multi-bit digital signal corresponds to a number of discrete values between which the analog signal varies—the greater the number of bits present, the larger the number of discrete values for the analog signal. For example, for a 5 Volt (V) system, an eight bit digital signal can represent 256 (i.e., $2^8$) different voltage values; where voltage values range from a minimum of 0V to a maximum of 5V with 254 voltage steps in between, wherein each voltage step is spaced at 5/255 V from neighboring voltage steps. Thus, by varying the multi-bit input signal supplied to a DAC, analog signals output by the DAC vary in a piecewise continuous manner, and are still referred to as analog signals because of their analog character. Analog signals as provided by a DAC may be either voltage signals, also referred to as signals in the voltage domain, or current signals, also referred to as signals in the current domain.

Turning now to the figures, FIG. 1A illustrates a simplified block diagram of a wireless transmitter 100 that can suffer from some shortcomings. The wireless transmitter 100 comprises digital signal processing (DSP) circuitry 102, for example a baseband processor, where signals to be transmitted are processed digitally. The DSP provides a digital transmit signal 104 to a mixing DAC 106. The mixing DAC 106 converts the digital transmit signal 104 to an analog signal, for example an analog current signal, and also mixes the digital transmit signal and/or analog signal with a local oscillator (LO) signal 108 to output a mixed analog signal 110. A power amplifier 112 amplifies the mixed analog signal 110 to provide an amplified mixed analog signal 114, which is provided to the antenna 116 for wireless transmission.

Unfortunately, absent countermeasures, FIG. 1A's wireless transmitter 100 can be susceptible to "glitches" and other timing imperfections. This can be due to small differences in path lengths and/or capacitances in the mixing DAC 106. In extreme cases, these glitches can lead to errors in transmitted or received signals. In less extreme cases where the glitches are essentially self-correcting transients, the glitches can still cause excess power consumption due to the current and voltage excursions, thereby shortening the useful lifetime of the transmitter 100 between charges in mobile applications.

Figure 1B:
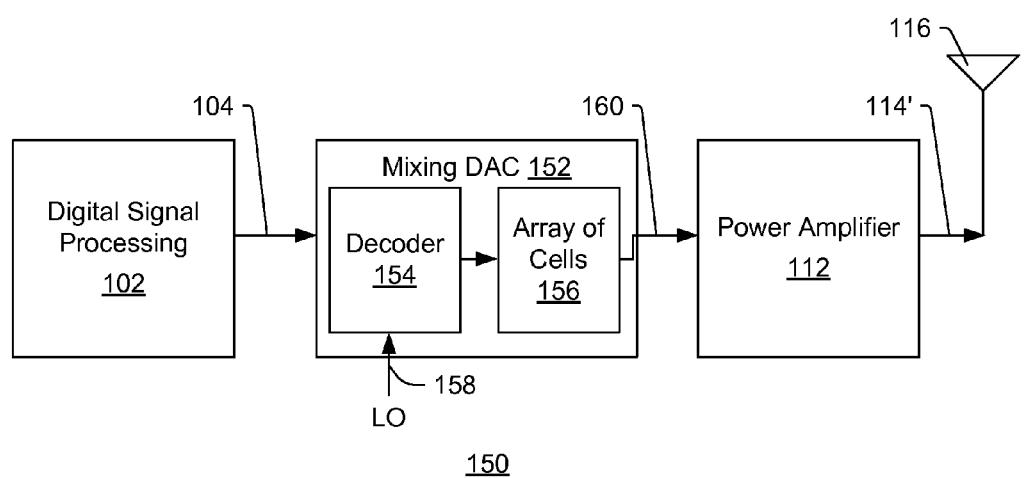
FIG. 1B shows a block diagram of a transmitter that includes an improved mixing DAC.

FIG. 1B shows a transmitter architecture 150 with an improved mixing DAC 152 in accordance with aspects of the present disclosure. As shown, the mixing DAC 152 includes decoder 154 and an array of cells 156. The cells within the array can include respective current sources that are selectively triggered based on respective control signals from the decoder 154. In particular, the control signals are based on the digital transmit signal 104, such that the number of current sources that deliver current to an output terminal of the mixing DAC 152 correspond to the digital value of the digital transmit signal 104 at a given time. To limit glitches and other timing imperfections, the decoder 154 modulates one or more of these control signals with the LO signal received on LO input terminal 158. Because the one or more control signals to the array 156 are modulated with the LO signal, the current sources in the array 156 tend to exhibit fewer current/voltage excursions, and the resultant analog signal 160 from the mixing DAC 152 is more tailored than in previous implementations. Therefore, relative to some conventional approaches, FIG. 1B's mixing DAC 152 may provide lower noise and lower power consumption and thereby improve data communication and the operable lifetime of the transmitter between charges.

Figure 2:
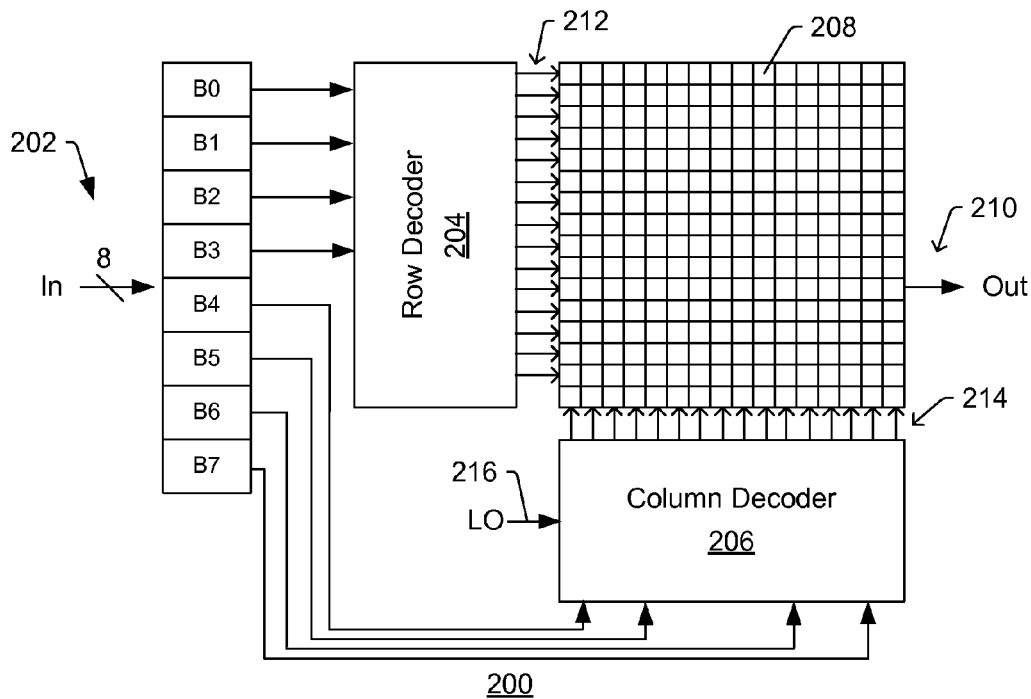
FIG. 2 shows a block diagram of a mixing DAC that uses LO-modulated control signals.

FIG. 2 shows a more detailed mixing DAC 200 (e.g., corresponding to one example of mixing DAC 152 in FIG. 1B) according to some aspects of the current disclosure. The mixing DAC 200 includes an input 202, row and column decoders 204, 206, a cell array 208, and an output 210. The column and row decoders 204, 206 provide control signals in the form of row and column thermometer encoded control signals (212, 214, respectively), wherein at least one of the control signals is modulated based on a LO signal 216. Although FIG. 2 shows an example where the LO signal 216 is provided to the column decoder 206 such that at least one column thermometer control signal 214 is LO-modulated; the LO signal 216 can alternatively be provided to the row decoder 204 such that at least one row thermometer control signal 212 is LO modulated.

In the example of FIG. 2, input 202 receives a multi-bit digital signal in the form of an eight bit signal, the bits being denoted B0 to B7 in FIG. 2. Bits B0 to B3, which may be the least significant four bits, are fed to thermometer row decoder 204; while bits B4 to B7, which may be the most significant four bits, are fed to thermometer column decoder 206. Thermometer decoders 204, 206 control cell array 208 which comprises $2^8$, i.e. 256, cells. When activated by a control signal from the decoders 204, 206; a current source within each cell of cell array 208 outputs a predetermined current, wherein the predetermined current output by a cell is the same as that of each other cell. These currents from any individual activated cells are summed to generate analog output signal 210.

The number of activated cells in array 208 depends on the eight bit value B0 to B7. For example, if a digital value of 0000_0000 (corresponding to a decimal value of zero) is set for B0-B7 and applied to the input 202, no cell in cell array 208 is activated and the output current on output 210 is zero. On the other hand, if all bits are set (i.e., B0-B7 are set to a digital value of 1111_1111, corresponding to a decimal value of 255), all cells in cell array 208 are activated to yield an output signal 210 which essentially is 256 times stronger than the output of a single cell. By changing the value of the multi-bit input signal provided to input 202 of mixing DAC 200, a controller (e.g., DSP 102 in FIG. 1B) can deliver a corresponding analog output signal on output 210 (e.g., for transmission over antenna 116 in FIG. 1B).

Although some previous DAC implementations may utilize a cell array, until now such cell arrays have been susceptible to "glitches" and other timing imperfections. This is largely due to differences in path lengths and/or capacitances in the control paths and the high-frequency nature of the LO signal. Because FIG. 2's control signals are modulated with the LO signal 216 prior to reaching the cells of array 208, the control signals are synchronized with high precision and the mixing DAC 200 exhibits reduced glitches relative to existing approaches. Again, the result is a more reliable DAC with lower power consumption.

Figure 3:
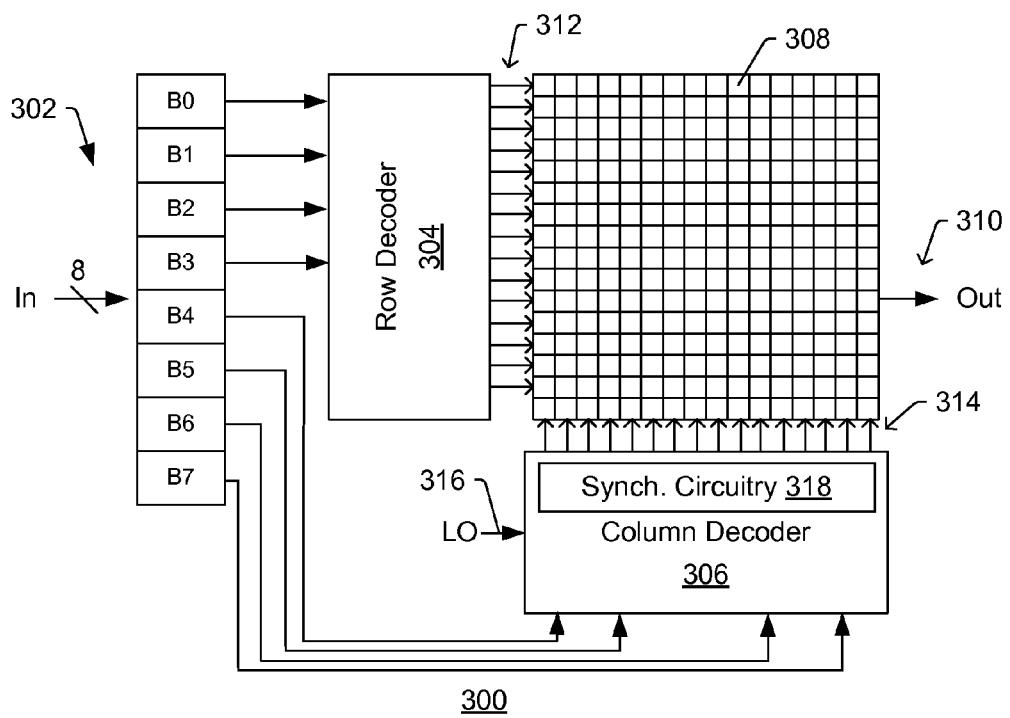
FIG. 3 shows a block diagram of another example of a mixing DAC that includes synchronization circuitry.

FIG. 3 shows an example of a mixing DAC 300 having synchronization circuitry 318 to limit glitches and other timing imperfections. Like FIG. 2's example, FIG. 3's mixing DAC 300 includes an input 302, row and column decoders 304, 306 which provide row and column thermometer encoded control signals 312, 314 to cell array 308, and an output 310. As will be appreciated in greater detail below with regards to FIGS. 4-6, synchronization circuitry 318 in the column decoder 306 modulates the column control signals 314 provided to the cell array 308 based on a local oscillator (LO) signal 316. Although the synchronization circuitry 318 is illustrated in the column decoder 306 in FIG. 3, the synchronization circuitry 318 could also be included in the row decoder 304 in other implementations. In such alternative arrangements, the row control signals 312 can be modulated with the LO signal 316, rather than the column control signals 314 being LO modulated as illustrated. In still other implementations, both the row and column control signals could be LO-modulated.

Figure 4:
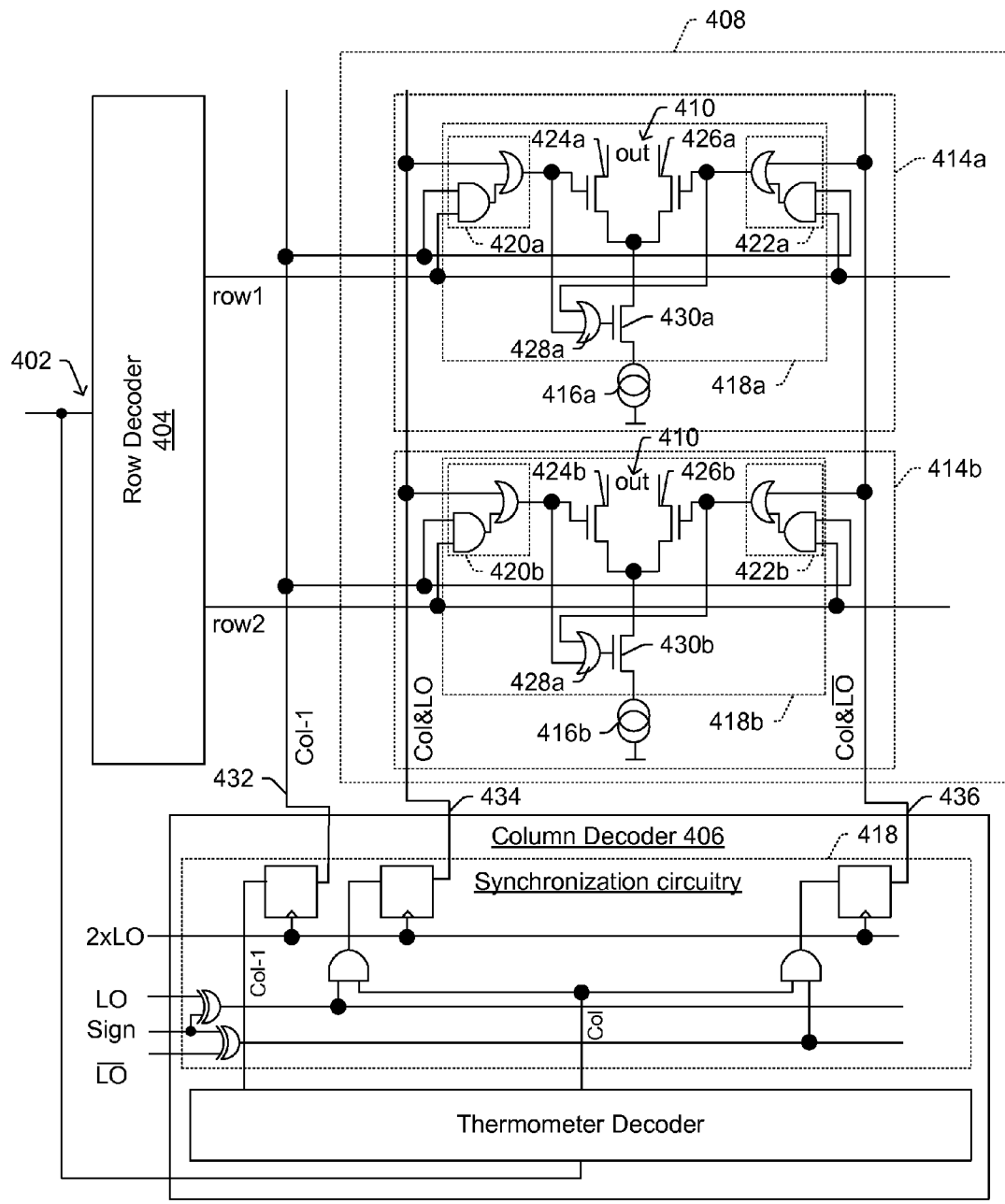
FIG. 4 shows a circuit diagram of a portion of a differential mixing DAC that includes synchronization circuitry and uses a current steering DAC.

FIG. 4 shows a more detailed implementation of a mixing DAC 400 having synchronization circuitry 418. Like FIG. 3's example, FIG. 4's mixing DAC 400 includes an input 402, row and column decoders 404, 406 which provide thermometer encoded control signals to cell array 408, and output 410. For purposes of clarity, FIG. 4 depicts only two cells (414a, 414b), although it will be appreciated that more cells are often present. The cells (414a, 414b) include current sources (416a, 418b, respectively) and mixers (418a, 418b, respectively). Each cell also comprises ANDOR-gates (420a, 420b; 422a, 422b), transistors (424a, 424b; 426a, 426b), an OR-gate (428a, 428b) and a transistor (430a, 430b) acting as a switch for the cell's current source.

Un-modulated "row" control signals are provided on "row" control lines (row1, row2), which are coupled to row thermometer decoder 404. An un-modulated "col" control line (col-1) 432 and LO-modulated "col" control lines (col&LO and col&LO_bar) 434, 436 are coupled to column thermometer decoder 406. By setting the control signals on control lines (row1, row2, col-1, col&LO, and col&LO_bar) to logical 1 or logical 0, the row and column thermometer decoders 404, 406 may selectively activate and deactivate cells of array 408.

For example, if col&LO is set to logical 1, OR col-1 and row1 are set to a logical 1; then ANDOR-gate 420a outputs a logical 1 to put switching transistor 430a and transistor 424a into conducting states between their source and drain terminals. In this case, the current of current source 416a contributes to the output 410 of the digital to analog converter. On the other hand, if row1 OR col-1 is set to logical 0, AND col&LO and col&LO_bar are a logical 0, transistors 424a, 426a, 430a are non-conducting between their sources and drains. In this case, current source 416a does not contribute to the output 410 of DAC. Therefore, by controlling the "col" lines and the "row" lines accordingly, the current sources or in other words the cells may be selectively activated or deactivated as described before. It is to be noted that the above-described control logic using ANDOR-gates 420, 422 is only one example for a control logic, and other implementations are equally possible.

Notably, the synchronization circuitry 418 in the column decoder 406 latches control signals using a series of flip-flops 440a, 440b, 440c, wherein the flip-flops are clocked at twice the LO frequency. The flip flops could also be clocked at higher frequencies, although this would tend to consume additional power. Flip-flop 440a latches the raw control signal Col-1, and flip flops 440b, 440c latch LO-modulated signals Col&LO and Col&LO_bar, respectively, based on a synchronization clock. In the example of FIG. 4, the synchronization clock has a frequency of two times the LO frequency (2×LO), but the synchronization clock can have much higher frequencies as well (e.g., the synchronization clock can have frequency N×LO, wherein N is any positive integer).

While FIGS. 2-4 have illustrated and described with regards to fully thermometer encoded mixing DACs, in other examples a mixing DAC may only be partially thermometer decoded, or not thermometer encoded. For example, for a 10 bit DAC, the eight most significant bits may be thermometer encoded, using for example the structure of FIG. 2, and for the two least significant bits two additional cells may be provided, which for example may each comprise a current source and a transistor acting as a switch similar to the cells shown in FIG. 4. For the least significant bit, the current source may have a current output ¼ of the current output of each of current sources of an array of cells of the thermometer encoded portion, and for the second least significant bit the current output of the current source may be ½ the current of each of the current sources of the cells of the array of the thermometer encoded portion in an example. The control transistors for these two cells are directly controlled by the bits, i.e., the least significant bit and the second least significant bit in the above example.

Further, although the mixers (e.g., 418a, 418b in FIG. 4) have been illustrated as current steering type mixers arranged in a differential configuration, wherein transistors actively regulate the current provided to output 410, other configurations are also possible. For example, FIG. 4's example could also be implemented as a single-ended configuration, rather than the illustrated differential configuration.

Figure 5:
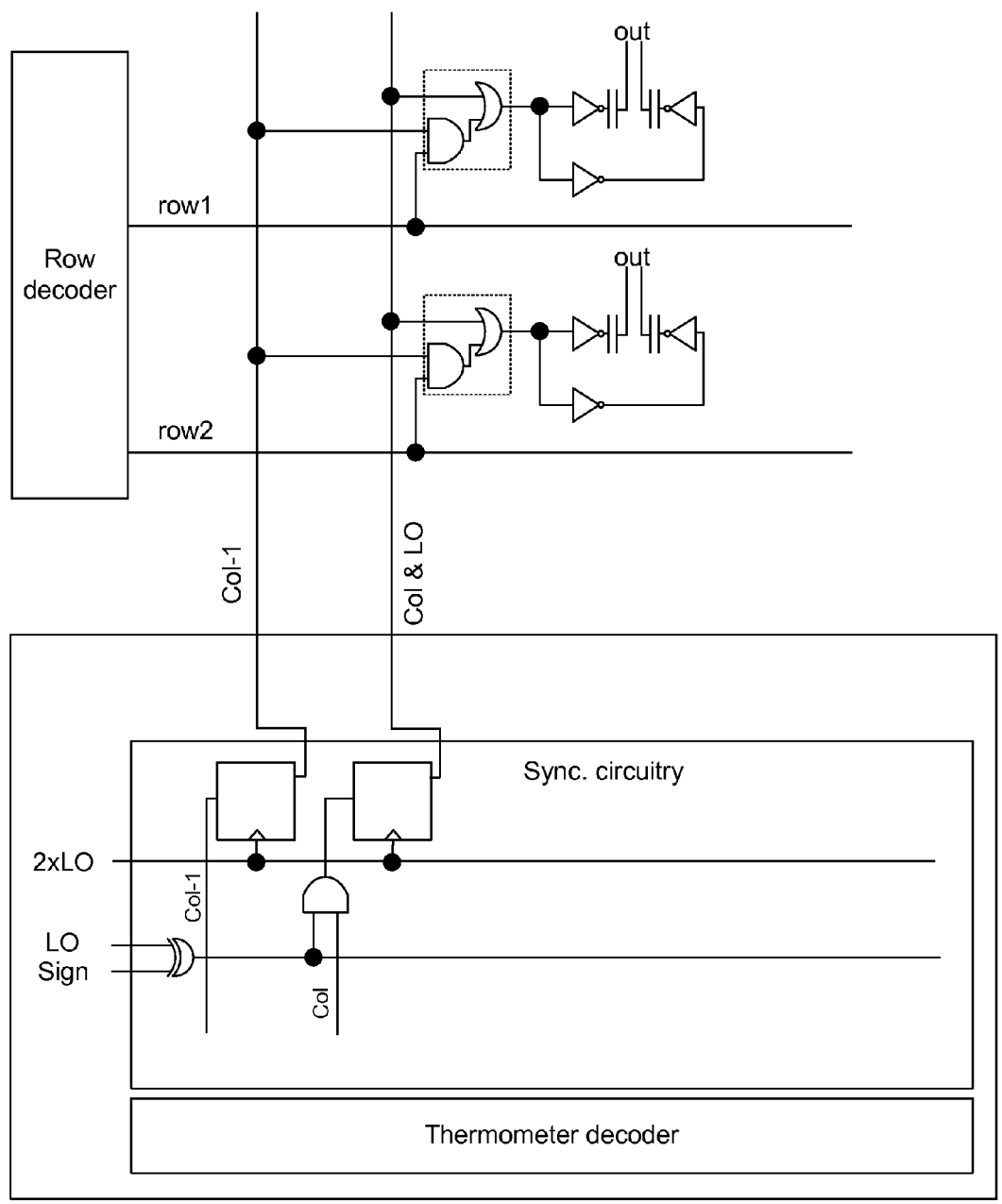
FIG. 5 shows a circuit diagram of a portion of a single-sided mixing DAC that includes synchronization circuitry and uses a capacitive DAC.

FIG. 5 shows an example of another single-ended configuration, albeit where individual cells include capacitive type mixers instead of current steering mixers as previously illustrated with regards to FIG. 4. In FIG. 5's example, each cell includes a pair of capacitors which store a predetermined charge as well as inverters. In this configuration, control signals are provided to the inverters such that the capacitors store charge, and then "dump" charge to the output only when triggered by the control signals. The end result is that the current at the output out DAC is again a summation of unit currents from whatever cells are individually activated.

Figure 6:
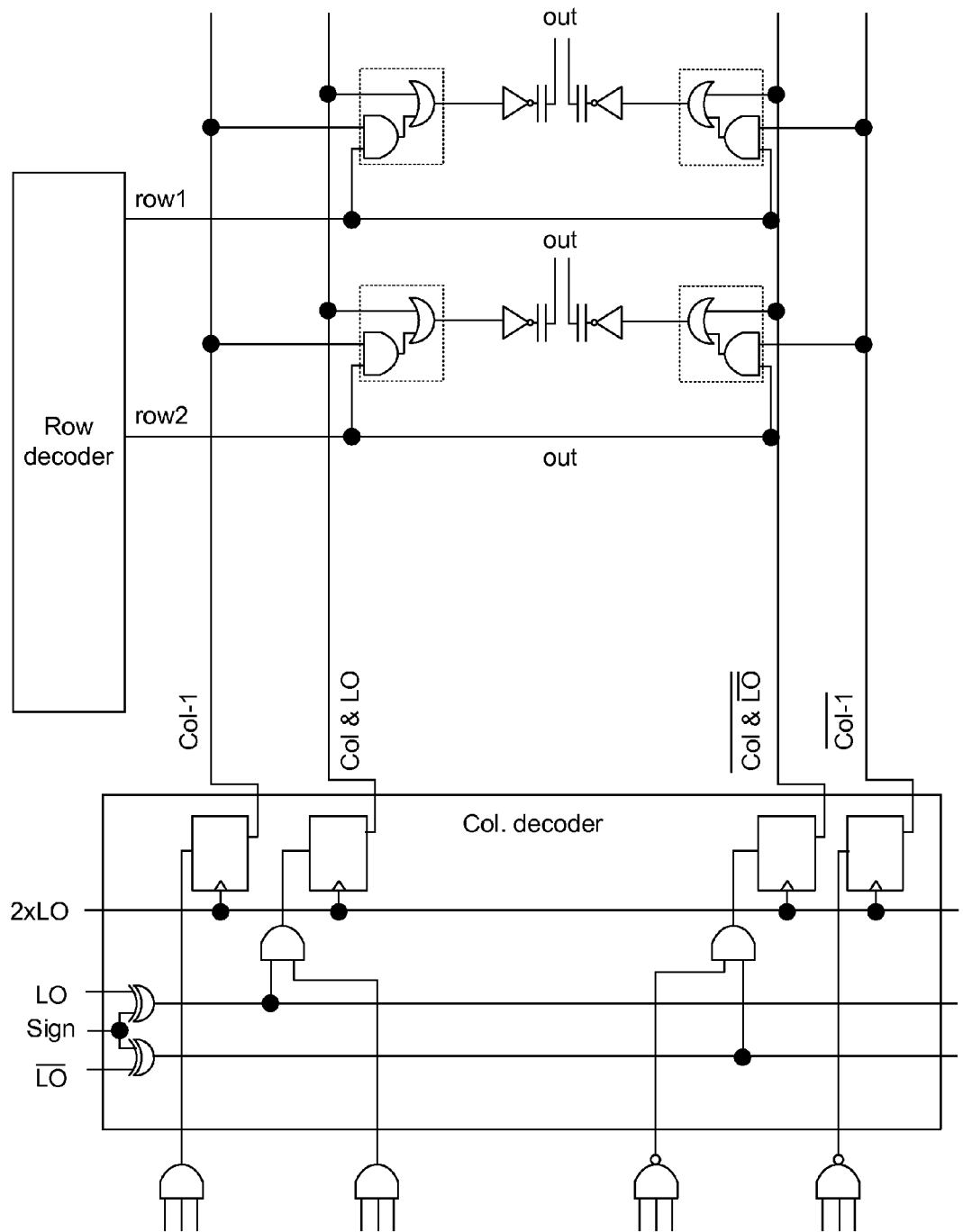
FIG. 6 shows a circuit diagram of a portion of a differential mixing DAC that includes synchronization circuitry and includes a capacitive DAC.

FIG. 6 shows another example of a differential configuration, but where individual cells include capacitive type mixers. As described with regards to FIG. 5, the capacitive type mixers include capacitors that are selectively discharged based on the row and column control signals provided by the row and column decoders.

Figure 7:
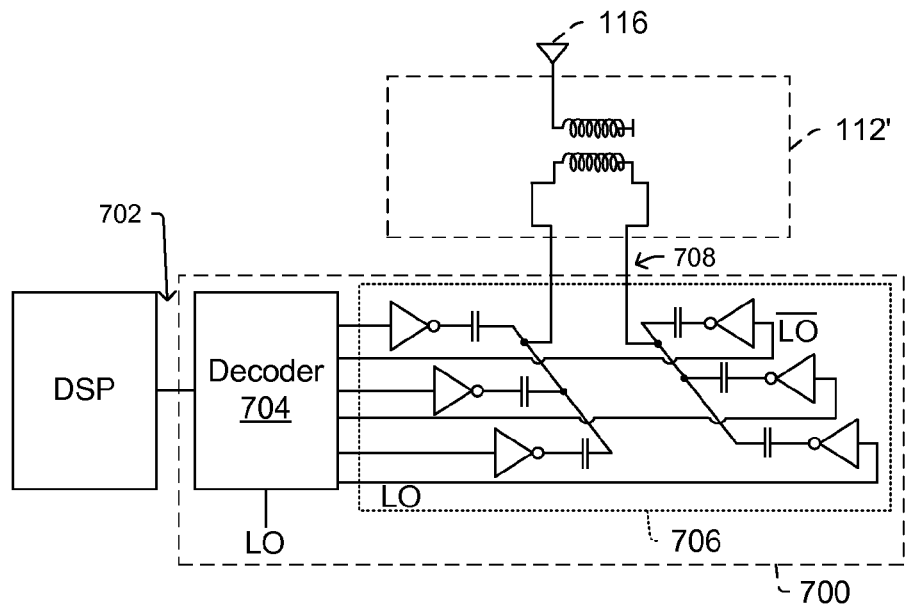
FIG. 7 shows a circuit diagram of a transmitter that makes use of a differential capacitive mixing DAC.

FIG. 7 illustrates an example of a capacitive mixing DAC 700 (e.g., mixing DAC 152 in FIG. 1B). Unlike previous examples where transistors constituted current sources in the array, unit capacitors that act as the current sources. The capacitive DAC 702 includes a digital input 702, a decoder 704, a cell array 706, and an analog output 708. Digital input 702 can be a serial or parallel bus arranged to receive a multi-bit digital signal, which is fed to decoder 704. Control lines couple the decoder 704 to respective cells within cell array 706, wherein the respective cells include respective discharge trigger elements (e.g., inverters) and respective capacitors. Typically, the capacitors each have the same unit capacitance value, such that each capacitor outputs an equal predetermined current when triggered by its corresponding discharge trigger element. The currents from any individually activated capacitors are summed on a current summing path, which is coupled to analog output 708. Although FIG. 7 only illustrates three cells for simplicity, it will be appreciated that a much larger number of cells is often included in array 706.

During operation of FIG. 7's capacitive DAC 700, the number of capacitors from which current discharge is triggered at any given time (and corresponding output current on analog output terminal 708) depends on the digital input supplied on input 702. For example, consider an example where the digital input is an eight bit digital value, and wherein the array 706 includes 255 cells. In such a case, a digital value of 0000_0000 (corresponding to a decimal value of zero) can be applied to the input 702, causing all discharge trigger elements to be off (i.e., no current is discharged from capacitors and the output current on output 708 is essentially zero). On the other hand, a digital value of 1111_1111, corresponding to a decimal value of 255) can be applied to the input 702, causing all discharge trigger elements to be activated triggering current discharge from all 255 unit capacitors. Thus, the digital value of 1111_1111 provides an output signal 708 which essentially is 255 times stronger than the output of a single capacitor. By changing the value of the multi-bit input signal provided to input 702 of capacitive DAC 700, a controller (e.g., DSP 102 in FIG. 1A or 1B) can deliver a corresponding analog output signal on output 708 (e.g., for transmission over antenna). Because the individual cells of capacitive DAC 700 are capacitive cells that include passive capacitor elements, rather than transistors that dictate current flow, FIG. 7's implementation can save area in some process technologies by reducing the number of transformers needed to implement DAC functionality. Thus, FIG. 7's architecture can provide some benefits not available with conventional architectures.

Figure 8:
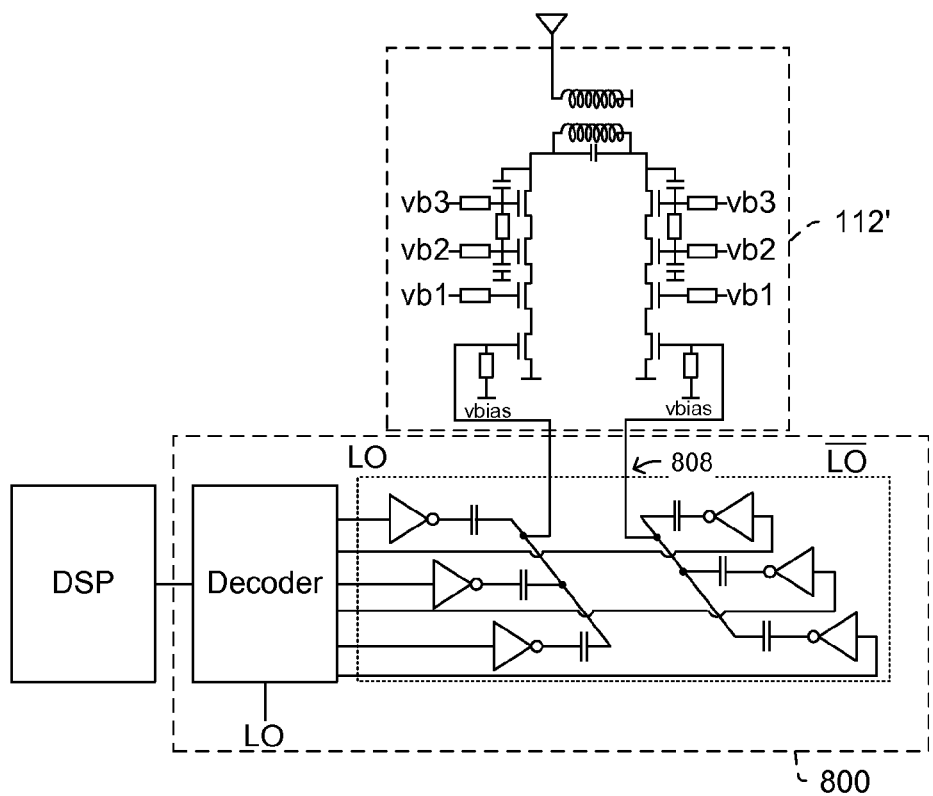
FIG. 8 shows a circuit diagram of a transmitter that makes use of a differential capacitive mixing DAC and a differential power amplifier that includes a number of stacked transistors on each of its input legs.

FIG. 8 shows an example of a capacitive DAC 800 having a differential output terminal 808. In FIG. 8's implementation, the power amplifier 112' has stacked transistors arranged on its current leg paths (e.g., 4 transistors on each current leg path in FIG. 8's example). The power amplifier also has a bias resistor on each leg.

Figure 9:
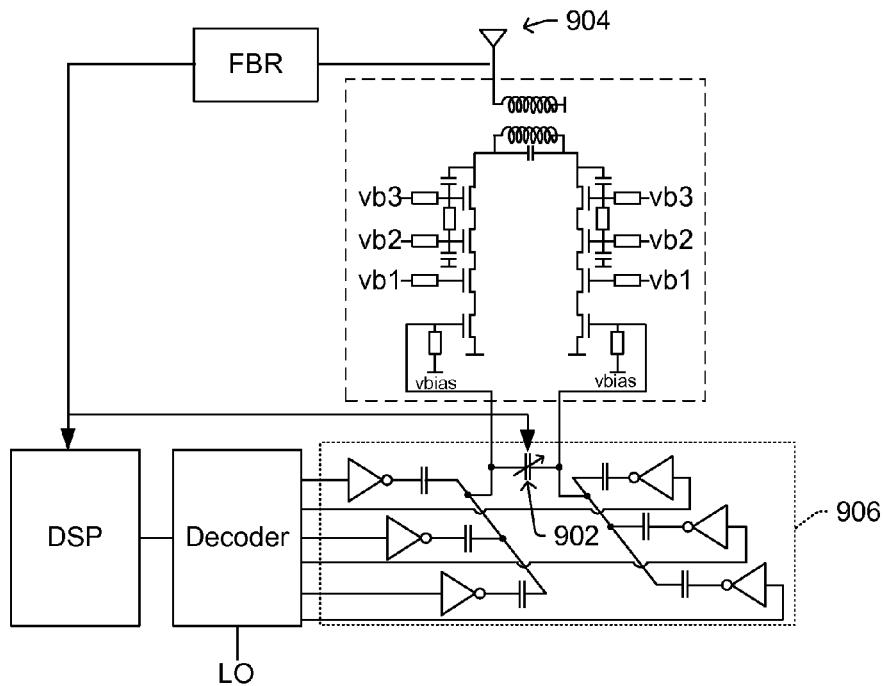
FIG. 9 shows a circuit diagram of a transmitter that makes use of a differential capacitive mixing DAC, which includes a variable capacitor that straddles the input power amplifier terminals.

FIG. 9 shows another example of a transmitter 900, wherein a variable capacitor 902 is coupled between the current summing paths of the ADC. The capacitance of the variable capacitor 902 can be adjusted to increase the gain. In particular, the capacitance of the variable capacitor 902 is adjusted based on a difference between the actual transmitted power spectrum transmitted by the antenna 904, such as measured by a feedback receiver (FBR) coupled to the antenna 904, and a wanted transmitted power spectrum. The value of this variable capacitor 902 is in the same range as the sum of the other capacitors used in the DAC 906. In one example, the sum of the other capacitors in the DAC is 20 pf, so the capacitor 502 is adjustable between 0 . . . 40 pF. The realized range depends on application and wanted output power of the DAC.

Figure 10:
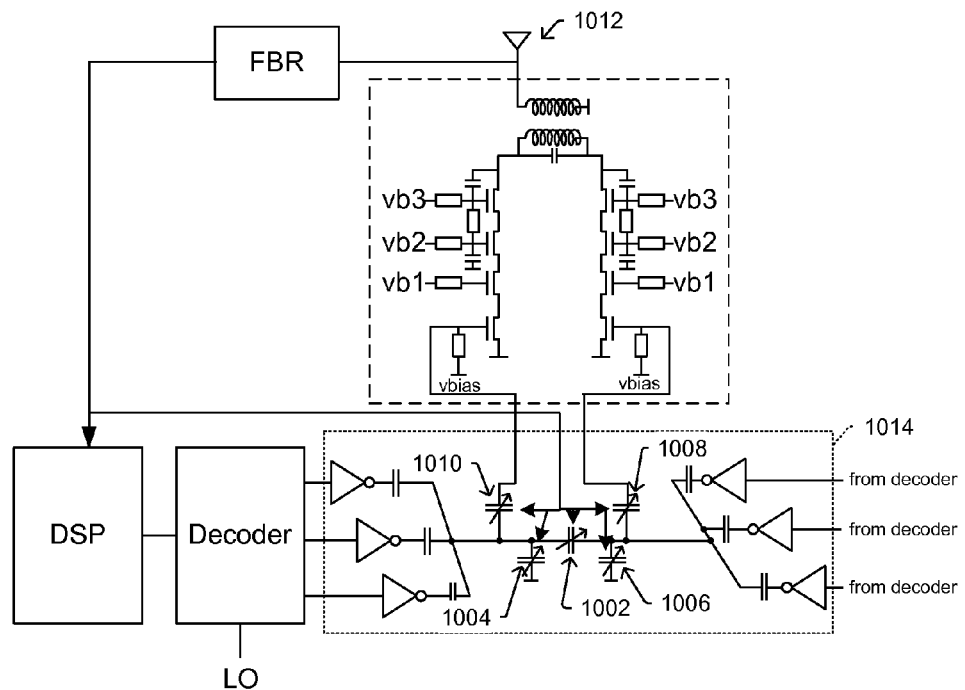
FIG. 10 shows a circuit diagram of another transmitter that makes use of a differential mixing DAC, which includes multiple variable capacitors to increase gain.

FIG. 10 shows another example of a transmitter, wherein variable capacitors 1002-1010 are coupled as shown and can be adjusted to increase the gain. In particular, the capacitance of the variable capacitors 1002-1010 are adjusted based on a difference between the actual transmitted power spectrum transmitted by the antenna 1012, such as measured by a feedback receiver (FBR) coupled to the antenna 1012, and a wanted transmitted power spectrum. The values of these variable capacitors 1002-1010 are in the same range as the sum of the other capacitors used in the DAC 1014. In one example, the sum of the other capacitors in the DAC is 20 pf, so the capacitors 1002-1010 are adjustable between 0 ... 40 pF. The realized range depends on application and wanted output power of the DAC.

While a plurality of different examples has been described with reference to the figures, the present disclosure is not limited to these examples, as a plurality of modifications is possible without departing from the scope of the present disclosure. Some examples for such modifications will be described below.

While in the example a specific logic involving AND-OR-gate (e.g., 420a in FIG. 4) has been described in FIGS. 4-6 for controlling the cells, other logics can also be used. Generally, the cells of the examples of FIGS. 4-6 may be activated by supplying a logical 1 to a node corresponding to the output of ANDOR-gate 420a, and deactivated by applying a logical 0 to this node. The specific gates or controllers like thermometer decoders used for activation and deactivation depend on the specific implementation. For example, if cells like the ones of FIG. 4 to FIG. 6 are used for non-thermometer encoded bits, the respective bit may be directly applied to the above mentioned node corresponding to the output of ANDOR-gate 420a in the figures.

It should also be noted that various examples have been described and/or illustrated above using NMOS transistors, which are put to a conducting state between their sources and drains when a high voltage (e.g., logical 1) is supplied to their gates; and are put into a non-conducting state between their sources and drains when a low voltage (e.g., logical 0) is supplied to their gates. In another example, the control logic may be reversed, and PMOS transistors may be used. In still other examples, PMOS transistors may be used instead of NMOS transistors in cases where for example logical 1 is associated with a low voltage and logical 0 is associated with a high voltage. In still other examples, instead of some or all of the MOS transistors shown other types of transistors, for example bipolar transistors, may be used. For example, in case of bipolar transistors a base terminal serves as control terminal.

Thus it will be appreciated that one example described herein relates to a digital to analog converter (DAC). The DAC includes a digital signal input configured to receive a multi-bit digital input signal, and a plurality of cells arranged in rows and columns. Each cell includes a current source. A row decoder and a column decoder provide respective control signals to respective rows and respective columns to selectively couple a number of the current sources to an output of the DAC. The number of current sources which are coupled to the output by the control signals is dependent on the multi-bit digital input signal. At least one of the control signals is modulated based on a local oscillator signal.

Another example disclosed herein relates to a digital to analog converter (DAC). The DAC includes a digital signal input configured to receive a multi-bit digital input signal, and a plurality of cells including a plurality of current sources, respectively. Decoding circuitry is configured to provide control signals to selectively couple a number of the current sources to an output of the DAC, where the number of current sources coupled to the output by the control signals depends on the multi-bit digital input signal. Synchronization circuitry synchronizes control signals provided to respective current sources.

Still another example relates to a transmitter. The transmitter includes a digital signal processing unit to provide a digital transmission signal. The transmitter also includes a digital to analog converter to provide a radio frequency analog signal based on the digital transmission signal. The digital to analog converter comprises: a plurality of cells arranged in a series of rows and columns, where the plurality of cells include a plurality of current sources, respectively; row and column decoding circuitry configured to provide a local-oscillator-modulated control signal which is based on the digital transmission signal to selectively couple an output current from one or more cells to provide the radio frequency analog signal from an output terminal of the DAC. The transmitter also includes an antenna to transmit the radio-frequency analog signal.

It is to be understood that in the description of examples contained herein any direct connection or coupling between functional blocks, devices, components, circuit elements or other physical or functional units shown in the drawings or described herein could also be implemented by an indirect connection or coupling, i.e., a connection or coupling comprising one or more intervening elements. Furthermore, it should be appreciated that functional blocks or units shown in the drawings may be implemented as separate circuits in some examples, but may also be fully or partially implemented in a common circuit or common integrated circuit in other examples, or in some cases may also be implemented jointly by programming a processor accordingly.

It should be noted that the drawings are provided to give an illustration of some aspects and features of examples of the present disclosure and are to be regarded as schematic only. In particular, the elements shown in the drawings are not necessarily to scale with each other, and the placement of various elements in the drawings is chosen to provide a clear understanding of the respective example and is not to be construed as necessarily being a representation of the actual relative location of the various components and elements shown. The features of the various examples described herein may be combined with each other. On the other hand, describing an example with a plurality of features is not to be construed as indicating that all those features are necessary for practicing the present disclosure, as other examples may comprise less features and/or alternative features.

What is claimed is:

1. A digital to analog converter (DAC) comprising:
   a digital signal input configured to receive a multi-bit digital input signal;
   an array of unit cells to provide an analog output signal to an output terminal of the DAC, and
   a decoder to provide at least one control signal to selectively and concurrently couple a number of the unit cells to the output terminal of the DAC based on the multi-bit digital input signal, where the at least one control signal is modulated based on a local oscillator (LO) signal.

2. The DAC of claim 1, where the number of unit cells coupled to the output by the at least one control signal are selected to provide a current level at the output terminal of the DAC at a given time to correspond to a digital data value of the multi-bit digital input signal at a corresponding time.

3. The DAC of claim 1, wherein the array of unit cells are arranged in rows and columns; and wherein the decoder comprises a row decoder and a column decoder to provide control signals to rows and columns of the array.

4. The DAC of claim 3, further comprising:
   a plurality of synchronization elements to synchronize the at least one control signal over multiple rows or multiple columns prior to delivery of the at least one synchronized control signal to the multiple rows or multiple columns.

5. The DAC of claim 4, wherein the synchronization elements are clocked at a clock derived from the LO signal.

6. The DAC of claim 5, wherein the synchronization elements are clocked at a fractional-integer of the LO signal.

7. The DAC of claim 3, wherein a unit cell of the array of unit cells further comprises a mixer comprising a first and a second transistor that are arranged in a differential configuration to selectively steer current from the cell to the output terminal of the DAC.

8. The DAC of claim 1, wherein a unit cell of the array of unit cells further comprises a unit capacitor and a corresponding discharge trigger element, the discharge trigger element configured to selectively trigger discharge from the unit capacitor.

9. A transmitter, comprising:
    a digital signal processing unit to provide a digital transmission signal;
    a digital to analog converter (DAC) configured to provide a radio frequency analog signal based on the digital transmission signal, the digital to analog converter comprising:
        a plurality of unit cells arranged in a series of rows and columns; and
        a row and column decoding circuitry configured to provide a local-oscillator-modulated control signal based on the digital transmission signal to selectively provide an output current from one or more of the plurality of unit cells to provide the radio frequency analog signal from an output terminal of the DAC.

10. The transmitter of claim 9, wherein the digital to analog converter comprises: synchronization circuitry to provide control signals that are modulated at a local oscillator frequency.

11. The transmitter of claim 10, wherein the synchronization circuitry includes flip-flop or latch elements that latch a thermometer encoded control signal based on a synchronization clock signal having a frequency that is at least approximately twice as large as a local oscillator frequency.

12. The transmitter of claim 9, wherein row decoding circuitry or column decoding circuitry comprises:
    a thermometer decoder to provide a row or column control signal;
    logic to modulate the row or column control signal with a local oscillator signal having a local oscillator frequency; and
    a flip-flop or latch element to latch the modulated row or column control signal based on a synchronization clock signal having a frequency that is at least twice the local oscillator frequency.

13. The transmitter of claim 9, wherein a current source of a unit cell of the plurality of unit cells comprises one or more capacitors.

14. A method of converting a multi-bit digital input signal into an analog output signal, comprising:
    converting the multi-bit digital input signal into at least one control signal that is modulated based on a local oscillator (LO) signal;
    selectively activating one or more of an array of unit cells based on the at least one control signal; and
    coupling an output of the selectively activated unit cells to an output to from the analog output signal.

15. The method of claim 14, wherein the number of unit cells activated and coupled to the output are selected to provide a quantity value to correspond to a data value of the multi-bit digital input signal.

16. The method of claim 15, wherein converting the multi-bit digital input signal into at least one control signal comprises:
    converting a first portion of the multi-bit digital input signal into a plurality of row control signals;
    converting a second, different portion of the multi-bit digital input signal into a plurality of column control signals; and
    modulating one or both of the row control signals and the column control signals with the LO signal.

17. The method of claim 16, further comprising synchronizing one or both of the row control signals and the column control signals over multiple rows or multiple columns prior to delivery thereof to the array of unit cells.

18. The method of claim 16, wherein the first portion corresponds to the least significant bits of the multi-bit digital input signal, and the second portion corresponds to the most significant bits of the multi-bit digital input signal.

19. The method of claim 14, wherein selectively activating one or more of an array of unit cells comprises steering current from an activated unit cell of the array to the output.

20. The method of claim 14, wherein selectively activating one or more of an array of unit cells comprises steering charge from an activated unit cell of the array to the output.

* * * * *